United States Patent
Leobandung

(10) Patent No.: US 10,832,942 B2
(45) Date of Patent: Nov. 10, 2020

(54) NON-EMBEDDED SILICON BRIDGE CHIP FOR MULTI-CHIP MODULE

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/571,832

(22) Filed: Sep. 16, 2019

(65) Prior Publication Data
US 2020/0013667 A1    Jan. 9, 2020

Related U.S. Application Data

(63) Continuation of application No. 15/825,263, filed on Nov. 29, 2017, now Pat. No. 10,483,156.

(51) Int. Cl.

| | | |
|---|---|---|
| H01L 21/82 | (2006.01) | |
| H01L 21/768 | (2006.01) | |
| H01L 23/00 | (2006.01) | |
| H01L 23/492 | (2006.01) | |
| H01L 23/50 | (2006.01) | |
| H01L 25/065 | (2006.01) | |
| H01L 25/00 | (2006.01) | |

(52) U.S. Cl.
CPC ............ *H01L 21/768* (2013.01); *H01L 21/82* (2013.01); *H01L 23/492* (2013.01); *H01L 23/50* (2013.01); *H01L 24/03* (2013.01); *H01L 24/26* (2013.01); *H01L 24/81* (2013.01); *H01L 24/92* (2013.01); *H01L 25/0655* (2013.01); *H01L 25/50* (2013.01); *H01L 24/13* (2013.01); *H01L 24/14* (2013.01); *H01L 24/16* (2013.01);

(Continued)

(58) Field of Classification Search
CPC ....... H01L 21/768; H01L 21/82; H01L 24/03; H01L 24/26; H01L 24/81; H01L 24/92
See application file for complete search history.

(56) References Cited

U.S. PATENT DOCUMENTS 6,768,208 B2    7/2004 Lin
7,402,901 B2    7/2008 Hatano
(Continued)

FOREIGN PATENT DOCUMENTS

CN    201374334 Y    12/2009

OTHER PUBLICATIONS

Deo, "Enabling Next-Generation Platforms Using Intel's 3D System-in-Package Technology", White Paper, FPGA, INTEL®, 2017, 7 pages.

(Continued)

*Primary Examiner* — Douglas M Menz
(74) *Attorney, Agent, or Firm* — Michael A. Petrocelli

(57) ABSTRACT

A semiconductor structure includes a free-floating silicon-bridge chip electrically joined on a top portion to two or more semiconductor chips and electrically joined on a bottom portion to a substrate structure that includes a plurality of metal interconnect structures and a plurality of metal layers disposed on an interlevel dielectric. The silicon bridge chip is aligned with and extends into a recess located in a region of the substrate structure away from the plurality of metal interconnect structures and the plurality of metal layers such that a top surface of the silicon bridge chip is substantially flush with a top surface of the substrate structure.

9 Claims, 9 Drawing Sheets

(52) U.S. Cl.
CPC .............. *H01L 24/29* (2013.01); *H01L 24/32* (2013.01); *H01L 24/83* (2013.01); *H01L 2224/131* (2013.01); *H01L 2224/1403* (2013.01); *H01L 2224/16145* (2013.01); *H01L 2224/16227* (2013.01); *H01L 2224/2919* (2013.01); *H01L 2224/32225* (2013.01); *H01L 2224/73253* (2013.01); *H01L 2224/81005* (2013.01); *H01L 2224/81801* (2013.01); *H01L 2224/83005* (2013.01); *H01L 2224/8385* (2013.01); *H01L 2224/92225* (2013.01); *H01L 2924/14* (2013.01); *H01L 2924/15153* (2013.01); *H01L 2924/15311* (2013.01); *H01L 2924/166* (2013.01); *H01L 2924/16152* (2013.01)

(56) References Cited

U.S. PATENT DOCUMENTS

| | | | |
|---|---|---|---|
| 8,163,600 | B2 | 4/2012 | Chow |
| 8,227,904 | B2 | 7/2012 | Braunisch |
| 8,866,308 | B2 | 10/2014 | Roy |
| 8,901,748 | B2 | 12/2014 | Manusharow |
| 9,543,249 | B1 | 1/2017 | Hu |
| 2005/0230842 | A1 | 10/2005 | Swanson |
| 2014/0070380 | A1* | 3/2014 | Chiu .................. H01L 23/5381 257/666 |
| 2014/0174807 | A1 | 6/2014 | Roy |
| 2015/0318236 | A1 | 11/2015 | Zhang |
| 2019/0164806 | A1 | 5/2019 | Leobandung |

OTHER PUBLICATIONS

Intel Corporation, "Embedded Multi-die Interconnect Bridge", A breakthrough in advanced packaging technology, Intel Custom Foundry EMIB, Accessed on May 11, 2017, pp. 1-10.

International Search Report and Written Opinion, International Application No. PCT/IB2018/058535, International Filing Date Oct. 31, 2018, 9 pages.

List of IBM Patents or Patent Applications Treated as Related. Filed Herewith. 2 pages.

* cited by examiner

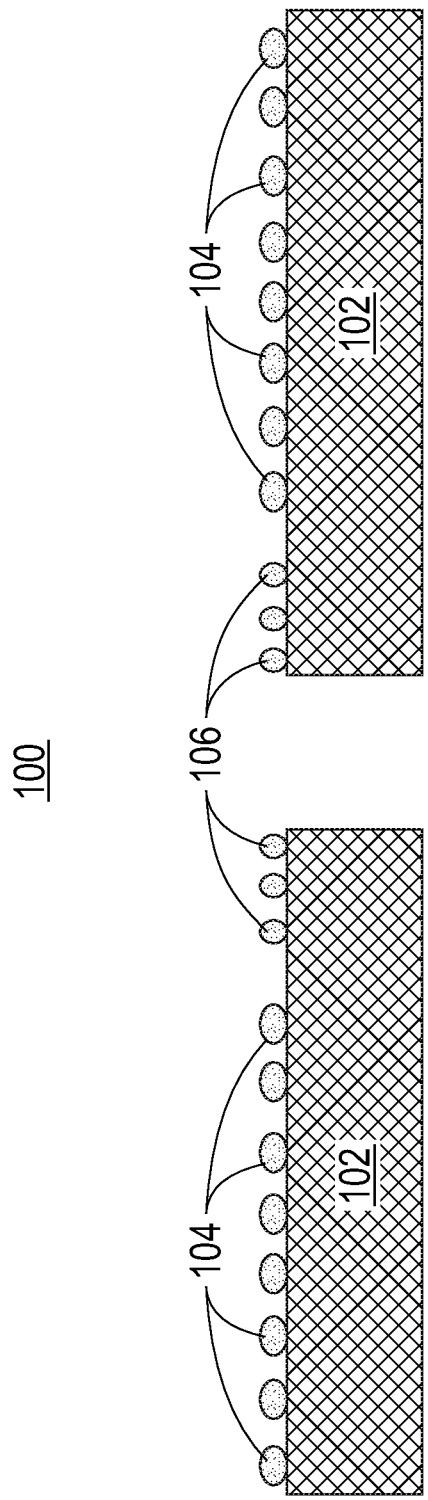

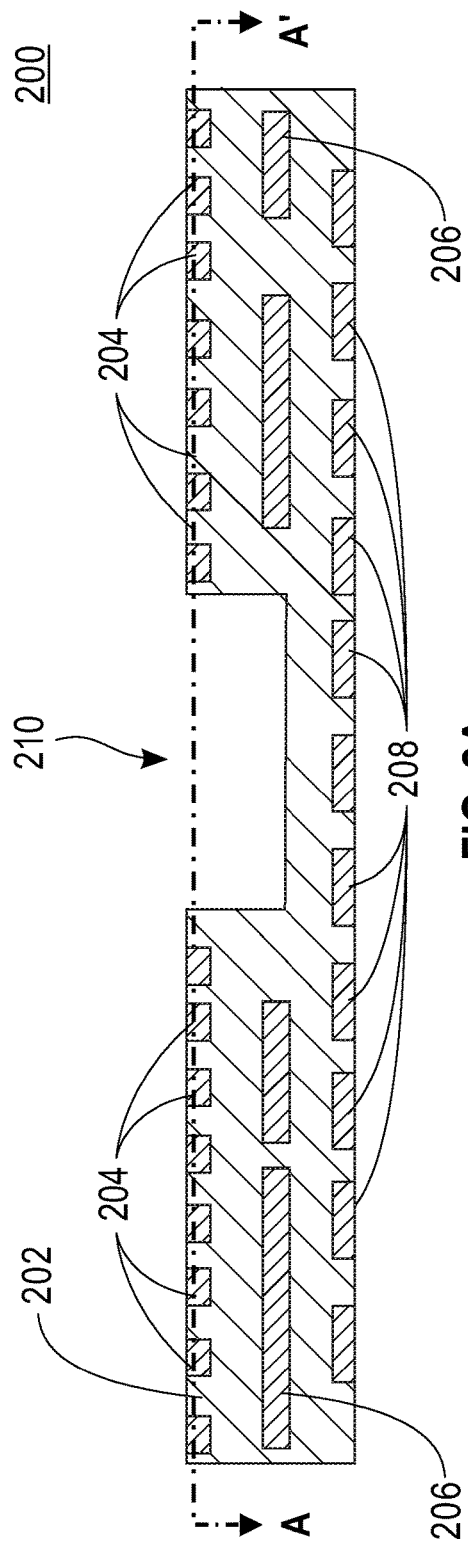
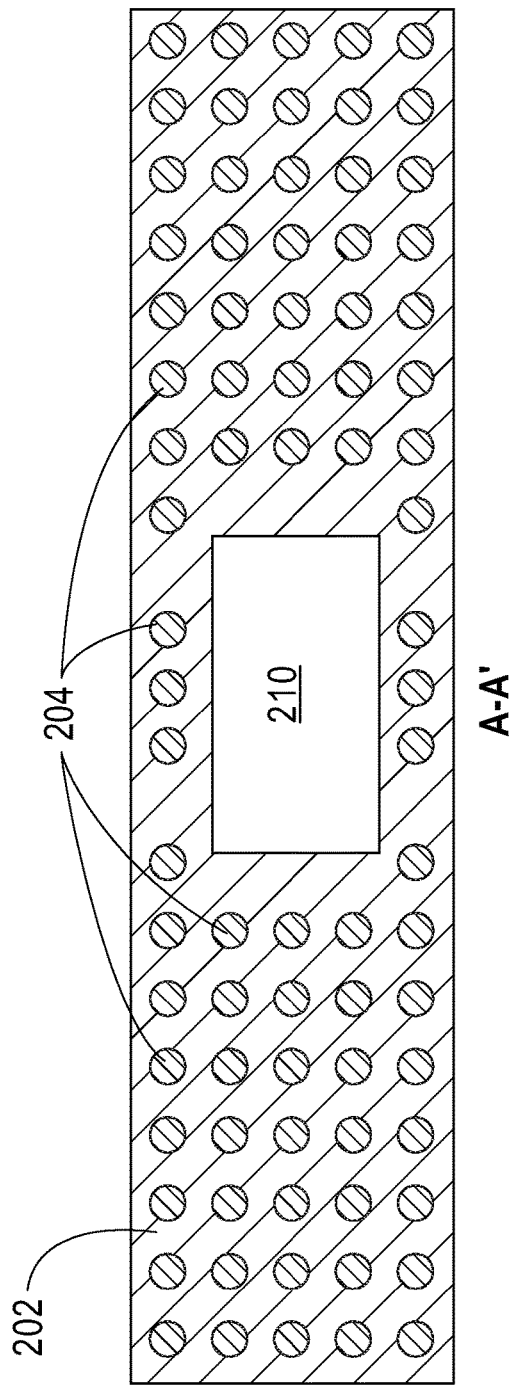
FIG. 2A
FIG. 2B

A-A'

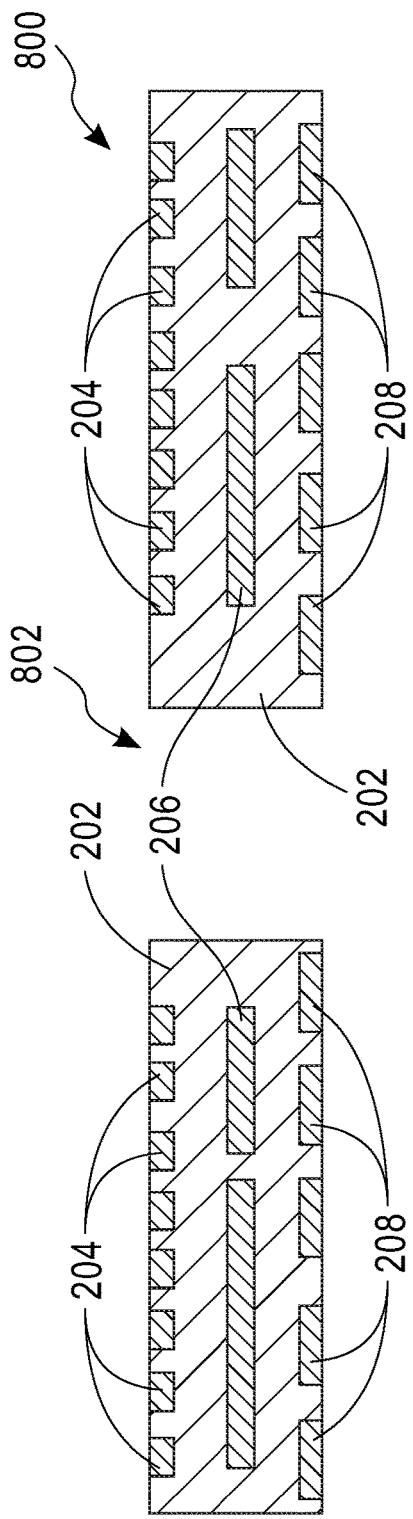
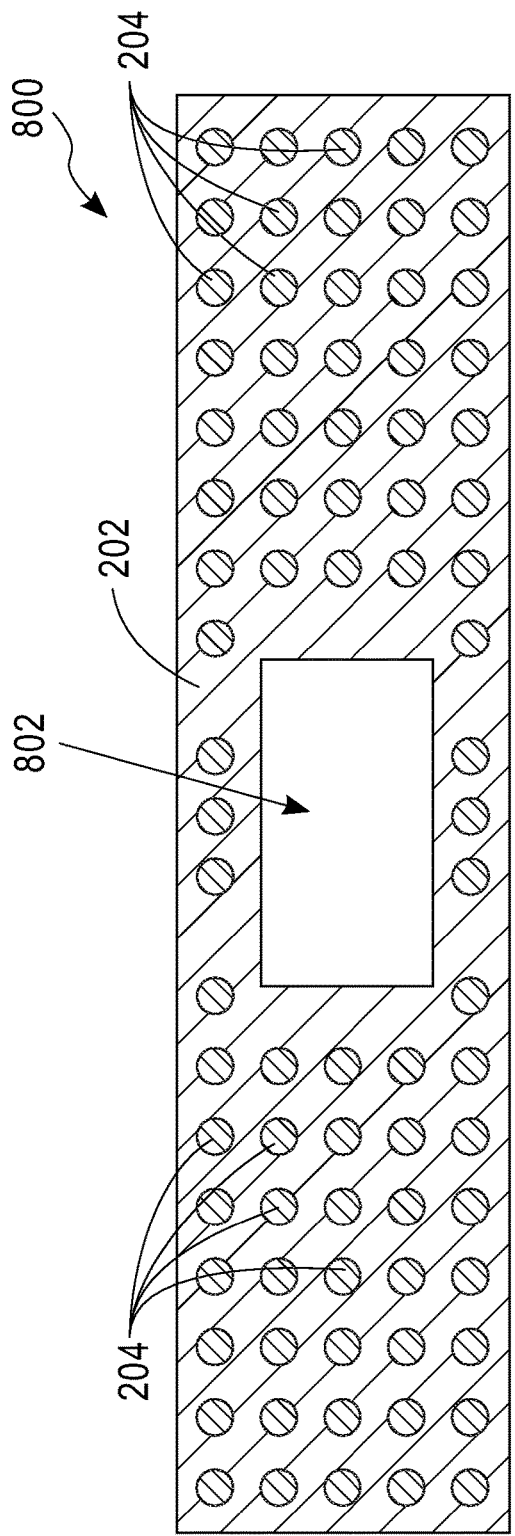
FIG. 8A
FIG. 8B

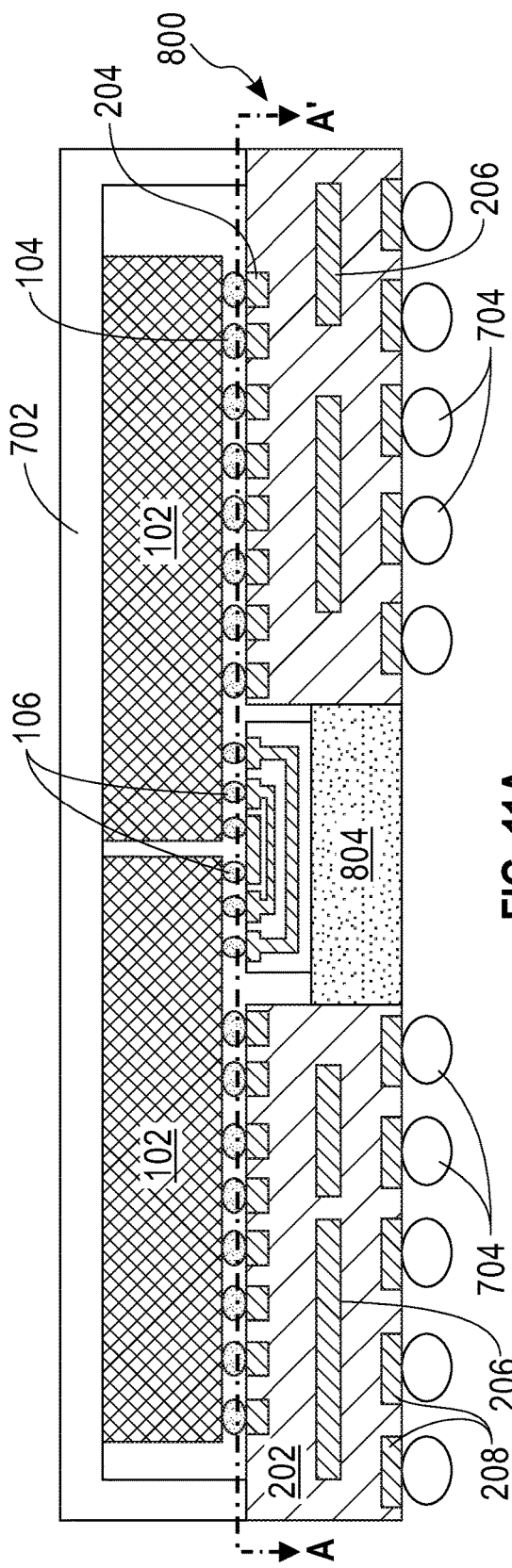
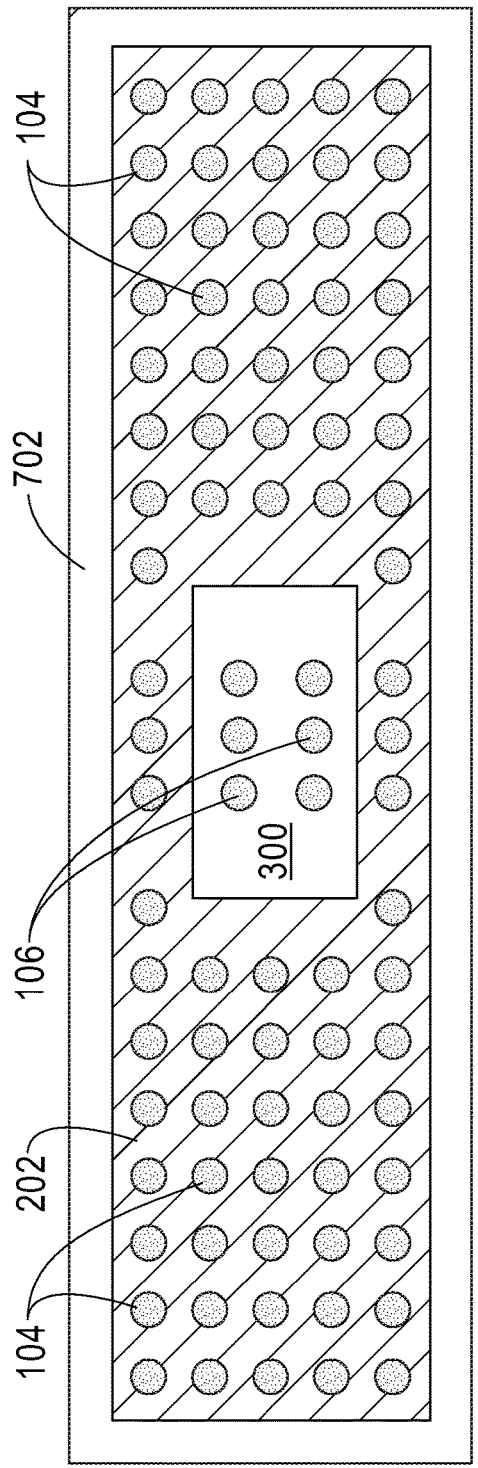
FIG. 11A
FIG. 11B
A-A'

NON-EMBEDDED SILICON BRIDGE CHIP FOR MULTI-CHIP MODULE

BACKGROUND

The present invention generally relates to packaging of semiconductor devices, and more particularly to a method of forming a multi-chip module with a non-embedded silicon bridge chip.

A multi-chip module typically refers to an electronic assembly including multiple integrated circuits (ICs or chips). Some multi-chip modules may include multiple integrated circuits arranged two dimensionally across a substrate, such as, for example, a laminated substrate (e.g. PCB) or a ceramic substrate. Such technologies are commonly referred to in the industry as two-dimensional or 2D packages.

Building from two-dimensional technology, some multi-chip modules include a silicon interposer between and separating the multiple integrate circuits and the substrate. Such technologies are commonly referred to in the industry as two and a half dimensional or 2.5D packages. 2.5D packages are particularly advantageous for their tremendous increased capacity and performance.

Lastly, other multi-chip modules may include chip-stack packages which have multiple chips arranged three dimensionally, or stacked vertically. 3D chip-stack packages are particularly advantageous for their increased package density, smaller footprint, and improved bandwidth due to the short connection lengths made possible by the use of through silicon vias. Such technologies are commonly referred to in the industry as three-dimensional or 3D packages.

SUMMARY

According to an embodiment of the present disclosure, a method includes electrically joining two or more semiconductor chips to a silicon bridge chip, and electrically joining the two or more semiconductor chips to a substrate structure, the silicon bridge chip extends into a recess in the substrate structure such that a top surface of the silicon bridge chip is substantially flush with a top surface of the substrate structure.

According to another embodiment of the present disclosure, a method includes providing two or more semiconductor chips, wherein a first plurality of solder bumps is located on an inner top surface of the two or more semiconductor chips and a second plurality of solder bumps is located on an outer top surface of the two or more semiconductor chips, providing a silicon bridge chip, providing a substrate structure, the substrate structure including a recess, electrically joining the two or more semiconductor chips, using the first plurality of solder bumps, to the silicon bridge chip, electrically joining the two or more semiconductor chips, using the second plurality of solder bumps, to the substrate structure, the silicon bridge chip extends into the recess in the substrate structure such that a top surface of the silicon bridge chip is substantially flush with a top surface of the substrate structure, attaching a lid to the top surface of the substrate structure and a bottom surface of the two or more semiconductor chips, and forming a third plurality of solder bumps on a bottom surface of the substrate structure.

According to another embodiment of the present disclosure, a semiconductor structure includes two or more semiconductor chips electrically joined to a substrate structure; and a silicon bridge chip electrically joining the two or more semiconductor chips, the silicon bridge chip extends within a region of the substrate structure such that a top surface of the silicon bridge chip is substantially flush with a top surface of the substrate structure.

BRIEF DESCRIPTION OF THE DRAWINGS

The following detailed description, given by way of example and not intended to limit the invention solely thereto, will best be appreciated in conjunction with the accompanying drawings, in which:

FIG. 1 depicts an initial step in the assembly of a multi-chip module, according to an embodiment of the present disclosure;

FIG. 2A depicts a cross-sectional view of a substrate structure, according to an embodiment of the present disclosure;

FIG. 2B depicts a top view of FIG. 2A taken along section line A-A', according to an embodiment of the present disclosure;

FIG. 8A depicts a cross-sectional view of a substrate structure, according to an embodiment of the present disclosure;

FIG. 8B depicts a top view of FIG. 8A taken along section line A-A', according to an embodiment of the present disclosure;

FIG. 11A depicts a cross-sectional view of a multi-chip module, according to an embodiment of the present disclosure;

FIG. 11B depicts a top view of FIG. 11A taken along section line A-A', according to an embodiment of the present disclosure;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 3:
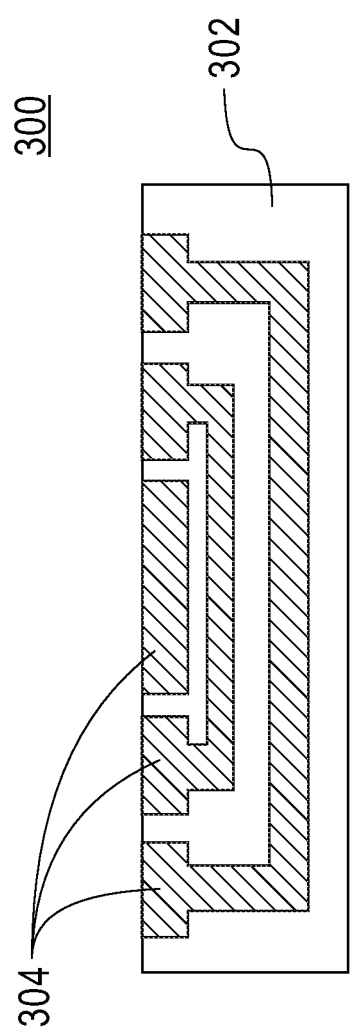
FIG. 3 depicts a silicon bridge chip, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may not be described in detail. In other instances, some processing steps or operations that are known in the art may not be described at all. It should be understood that the following description is rather focused on the distinctive features or elements of various embodiments of the present invention.

Current semiconductor technologies focus on the continuous improvement of manufacturing processes that may allow for the fabrication of high density, high performance, and low-cost semiconductor chips (also referred to as "dies"). Multi-chip modules or packages may have the potential for increased architectural flexibility at reduced cost but to do so must provide appropriate die-to-die interconnect densities in a cost-effective way. Interconnect density is an important consideration in semiconductor packaging, mainly because an insufficient number of die connections may limit bandwidth capabilities which has a negative effect on logic-logic and/or logic-memory communications.

Modern semiconductor packaging techniques require a maximum number of die-to-die interconnects. A typical solution to this limitation may include implementing 2.5D technologies, which propose the use of a silicon interposer and Through Silicon Vias (TSVs) to connect dies at silicon interconnect speed with a smaller footprint. But the resulting interconnect layout is extremely complex, and the required manufacturing techniques may delay tape-outs and reduce yield rates. A most recent approach includes embedding a small silicon bridge die in an organic substrate during the manufacturing process. However, the process of embedding the small silicon bridge die is extremely complex.

Therefore, embodiments of the present disclosure may, among other potential benefits, provide a method of forming a multi-chip module including a non-embedded silicon bridge die or chip. By implementing the proposed method, embodiments of the present disclosure may eliminate the need for large silicon interposers typically used in other 2.5D methods, and reduce layout complexity while improving yield rates.

The present invention generally relates to packaging of semiconductor devices, and more particularly to a method of forming a multi-chip module with a non-embedded silicon bridge chip. One way of forming the multi-chip module with non-embedded silicon bridge chip may include forming a recess within a substrate structure and, using a chip bonding process, attaching the silicon bridge chip to the substrate structure. Embodiments by which the multi-chip module with non-embedded silicon bridge chip may be formed is described in detailed below by referring to the accompanying drawings in FIGS. 1-11B.

Referring now to FIG. 1, an initial step in the assembly of a multi-chip module is shown, according to an embodiment of the present disclosure. At this step, an initial structure 100 including multiple semiconductor chips 102 may be formed or provided. For illustration purposes only, without intent of limitation, two semiconductor chips 102 are depicted in FIG. 1; however, additional semiconductor chips may be considered depending on a desired number of chips in the multi-chip design. The semiconductor chips 102 may each include a silicon substrate or other known semiconductor substrate.

At this step of the manufacturing process, the semiconductor chips 102 include solder bumps 104, 106. The solder bumps 104, 106 may be formed above and in direct contact with a bottom of the semiconductor chips 102. In general, the metallized pads are integrated into the surfaces of the semiconductor chips 102, and allow the semiconductor chips 102, here the initial structure 100, to be electrically connected to other substrate structures or substrates. The solder bumps 104, 106 are subsequently used to form electrical connections between the metalized pads of the initial structure 100 and metallized pads of an adjoining structure, such as, for example, a laminate substrate as discussed below. According to an embodiment, the solder bumps 104 may be reserved for electrically connecting the initial structure 100 to a substrate structure 200 (FIG. 2A), while the solder bumps 106 may be designed for electrically connecting one semiconductor chip 102 to the other semiconductor chip 102 via a silicon bridge chip 300 (FIG. 3), as described in detail below. It should be noted that the process of forming the solder bumps 104, 106 is typical and well known to those skilled in the art. In various embodiments, the solder bumps 104 may be the same size, smaller, or larger than the solder bumps 106. In one embodiment, it is particularly beneficial for the solder bumps 104 to be larger than the solder bumps 106 to allow for a higher density of connections between the two semiconductor chips (102).

Referring now to FIGS. 2A-2B, different views of a substrate structure 200 are shown, according to an embodiment of the present disclosure. In this embodiment, FIG. 2A depicts a cross-sectional view of the substrate structure 200, and FIG. 2B depicts a top view of FIG. 2A taken along section line A-A'. In an exemplary embodiment, the substrate structure 200 may be, for example, a laminated substrate, a ceramic substrate, or a printed circuit board (PCB).

The substrate structure 200 may include various metal interconnect structures 206 (hereinafter "interconnect structures") that may be formed in an interlevel dielectric 202. The interconnect structures 206 may typically be formed by laminating several layers of dielectric and metal according to processes well known for manufacturing of laminate substrates, ceramic substrates, or PCBs.

The substrate structure 200 may further include metal layers 204, 208 (also referred to as "metalized pads"). In general, the interconnect structures 206 provide the requisite electrical connections between the metal layer 204 and the metal layer 208. As such, the metal layers 204, 208 provide an electrical pad to connect or join the substrate structure 200 to another substrate structure, such as, the initial structure 100 of FIG. 1. The metal layers 204, 208 may generally include a copper-rich material formed by any suitable technique.

In this embodiment, a recess 210 may be formed in the substrate structure 200 as shown in FIGS. 2A-2B. Most typically, the recess 210 may be added as a final step after the substrate structure 200 is substantially complete. In such cases, the recess 210 would be etched out using laser ablation, ion etching, or physical drilling/milling to remove a portion of the interlevel dielectric 202. Alternatively, the recess 210 could be incorporated into the design of the substrate structure 200 and will be incorporated during manufacturing. The substrate structure 200 may be designed in a way such that a location of the recess 210 does not affect interconnect structures 206 or other electronic devices (not shown) within the substrate structure 200. In an embodiment, the recess 210 is generally located in the center of the substrate structure 200. In another embodiment, the recess 210 is located anywhere on the substrate structure 200, such as, for example, closer to one edge or in a corner of the substrate structure 200. In all cases, the location of the recess will correspond with a location of the silicon bridge chip (300).

In all cases, the recess is appropriately sized to accommodate the silicon bridge chip described below. In various embodiments, the shape of the recess 210 will correspond to the general shape of the silicon bridge chip (300). For example, a square recess will be used for a square bridge chip, and a rectangular recess will be used for a rectangular silicon bridge chip. In other embodiments, the shape of the recess may not correspond to the shape of the silicon bridge chip. For example, a square recess may be used for a circular silicon bridge chip. In order to accommodate the size and shape of the silicon bridge chip the recess 210 may be slightly larger than the actual size and shape of the silicon bridge chip. In practice, for example, the recess 210 may be several mm square and a depth ranging from approximately 10 µm to approximately 1 mm to accommodate the bridge chip.

Referring now to FIG. 3, a silicon bridge chip 300 is shown, according to an embodiment of the present disclosure. In an embodiment the silicon bridge chip 300 may be formed in the same way as the semiconductor chips 102, and may include similar wiring components. For example, the silicon bridge chip 300 may include an interlevel dielectric 302 in which interconnect structures (not shown) and other electronic devices (not shown) may be formed. The silicon bridge chip 300 also includes metal layers 304, including metalized pads. Like other structures, the metallized pads facilitate connecting the silicon bridge chip 300 to other substrate structures using known solder bump connection techniques. In an embodiment, the silicon bridge chip 300 is subsequently attached to the initial structure 100 to electrically join both semiconductor chips 102 together, as will be explained in detail below.

The silicon bridge chip 300 can be any size which may be integrated into a multi-chip package. In an embodiment, for example, the silicon bridge chip 300 may have a width ranging from approximately 1 mm to approximately 5 mm and a length ranging from approximately 1 mm to approximately 20 mm to accommodate connection between two chips 102. In an alternative embodiment, the silicon bridge chip may be large enough to electrically join more than two chips 102. For example, the silicon bridge chip 300 may be approximately 5 mm to approximately 20 mm square to facilitate electrical connections between four chips 102.

Figure 4:
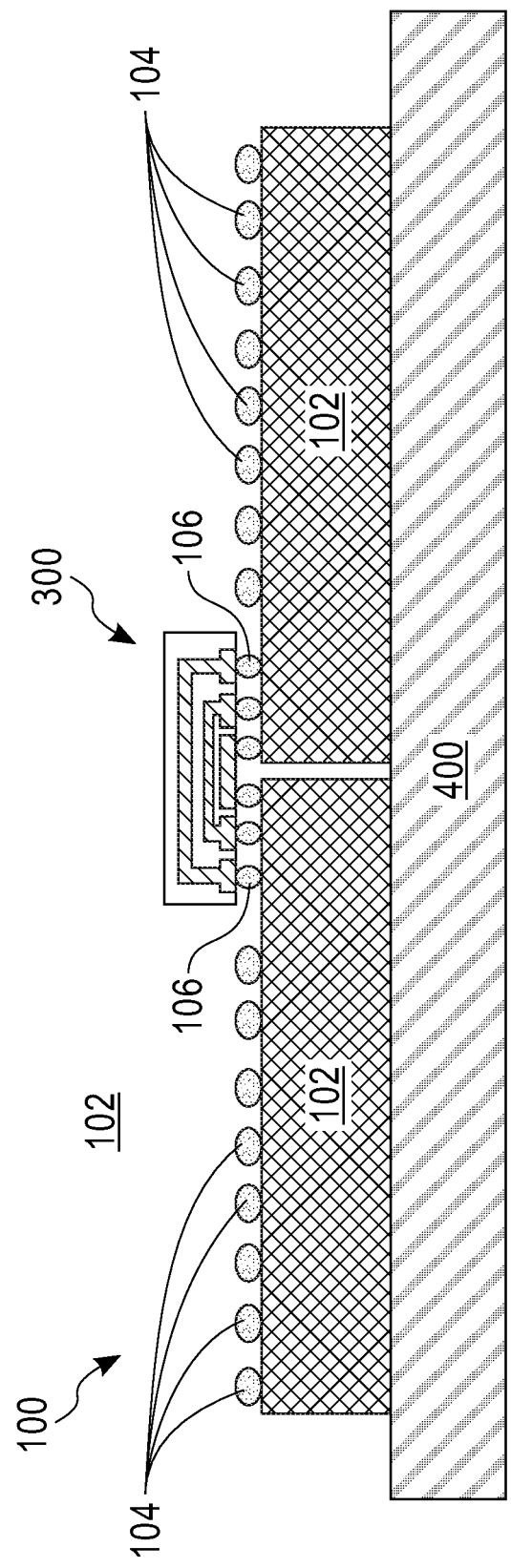
FIG. 4 depicts attaching the silicon bridge chip to an initial structure, according to an embodiment of the present disclosure.

Referring now to FIG. 4, silicon bridge chip 300 may be attached to the initial structure 100, according to an embodiment of the present disclosure. Specifically, the silicon bridge chip 300 is joined to the semiconductor chips 102 using typical chip attach processes well known in the art.

First, according to an embodiment, the semiconductor chips 102 are attached to a temporary substrate 400, which may support the semiconductor chips 102 in preparation for attachment of the silicon bridge chip 300. The temporary substrate 400 will also support the assembly after attaching the silicon bridge chip 300 during subsequent processing. In an alternative embodiment, the silicon bridge chip 300 may be joined to both semiconductor chips 200 and then the assembly is joined to the temporary support 400. Typically, an adhesive material (not shown) would be used to attach the semiconductor chips 102 to the temporary substrate 400. In some cases, the semiconductor chips 102 would be attached to the temporary substrate 400 such that they may be subsequently separated. For example, the chosen adhesive, or alternative attachment method, would allow the temporary substrate 400 to be subsequently removed. In an embodiment, the temporary substrate 400 may include a silicon wafer or other structurally sufficient material. In another embodiment, the temporary substrate 400 may include a glass wafer.

Figure 5:
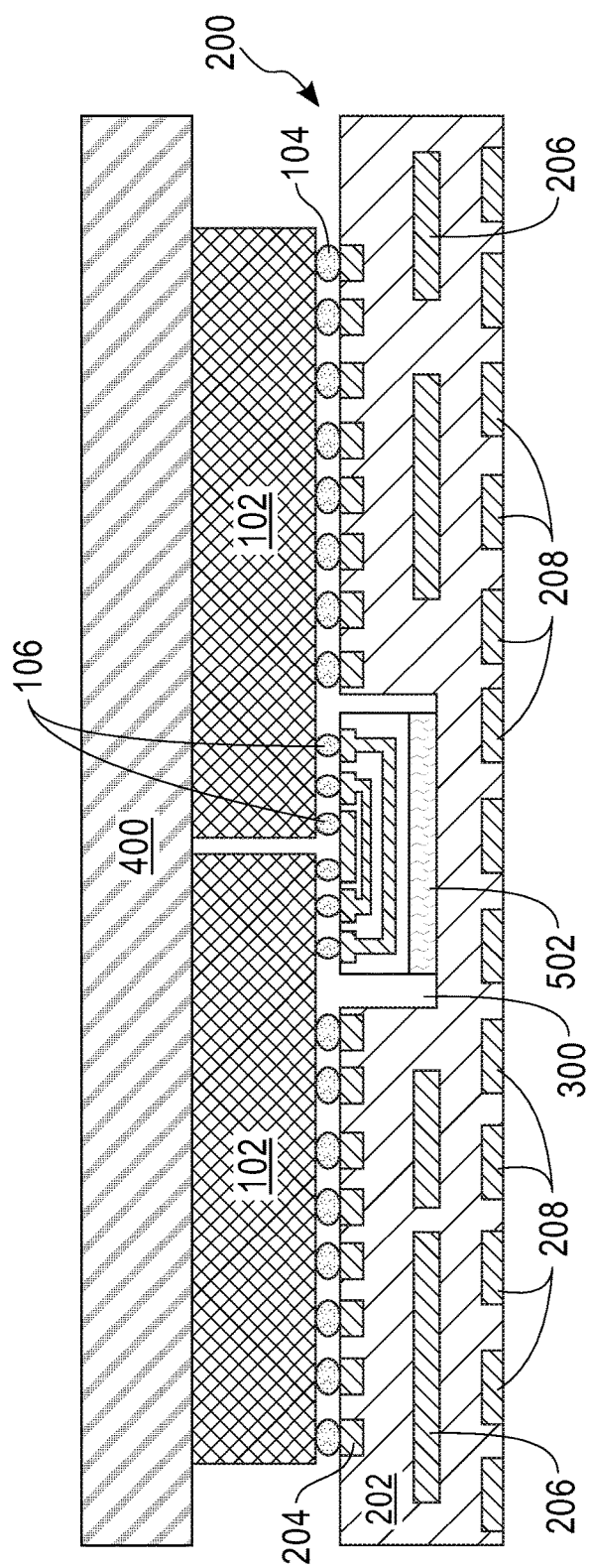
FIG. 5 depicts flipping a temporary substrate, according to an embodiment of the present disclosure.

Referring now to FIG. 5, the temporary substrate 400 is flipped and placed above the substrate structure 200, according to an embodiment of the present disclosure. Specifically, the temporary substrate 400 is flipped over so that the bottom sides of the semiconductor chips 102 having the solder bumps 104, 106 face down. The temporary substrate 400 may then be positioned in a way such that the silicon bridge chip 300 is aligned with the recess 210 (FIGS. 2A-2B), and the solder bumps 104 are aligned with matching metal layers 204 in the substrate structure 200.

At this point of the manufacturing process the solder bumps 104 may be attached to join semiconductor chips 102 to metal layers 204 using processes well known in the art. Next, in most cases, an underfill material is used to fill the void between the semiconductor chips 102 and the substrate structure 200 and physically secure one to other according to processes well known in the art. Additionally, in some embodiments, an adhesive material 502 may be placed between the silicon bridge chip 300 and a top surface of the substrate structure 200 (located at a bottom of the recess 210 of FIGS. 2A-2B). The adhesive material 502 will physically join the silicon bridge chip 300 to the substrate structure 200, providing additional structural support to the assembly. The adhesive material 502 may include any known suitable adhesive, such as known under fill materials.

Figure 6:
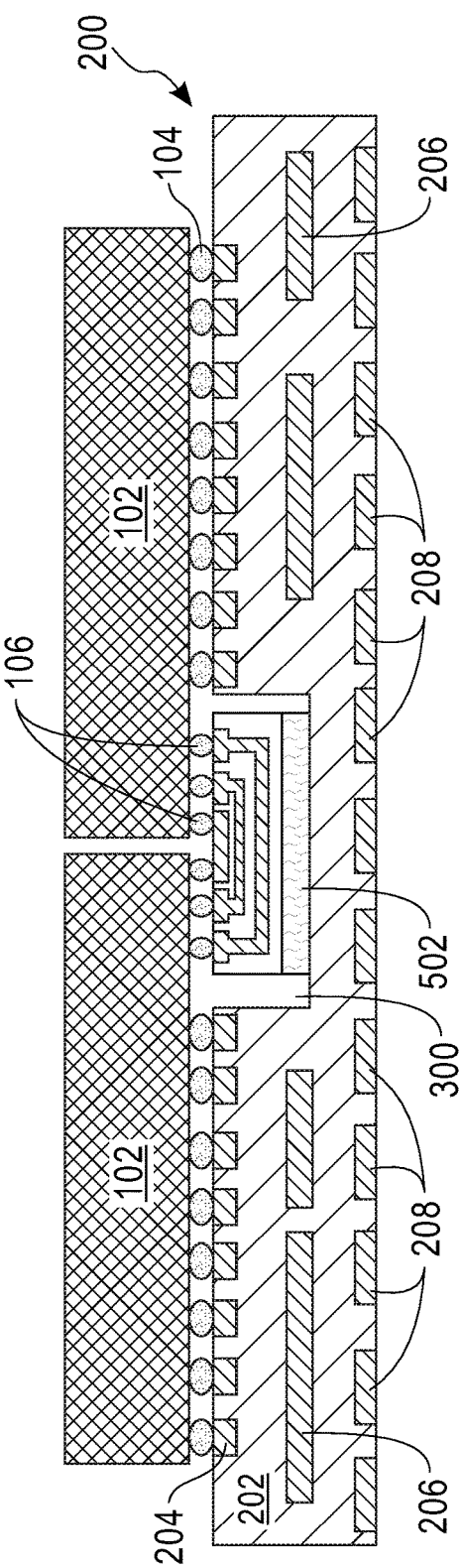
FIG. 6 depicts separating the temporary substrate from semiconductor chip, according to an embodiment of the present disclosure.

Referring now to FIG. 6, the temporary substrate 400 may be separated from the semiconductor chips 102, according to an embodiment of the present disclosure. After attaching the silicon bridge chip 300 and semiconductor chips 102 to the substrate structure 200, the temporary substrate 400 may be released and removed. It should be noted that after releasing the temporary substrate 400, tops of the semiconductor chips 102 may be exposed.

Figure 7A:
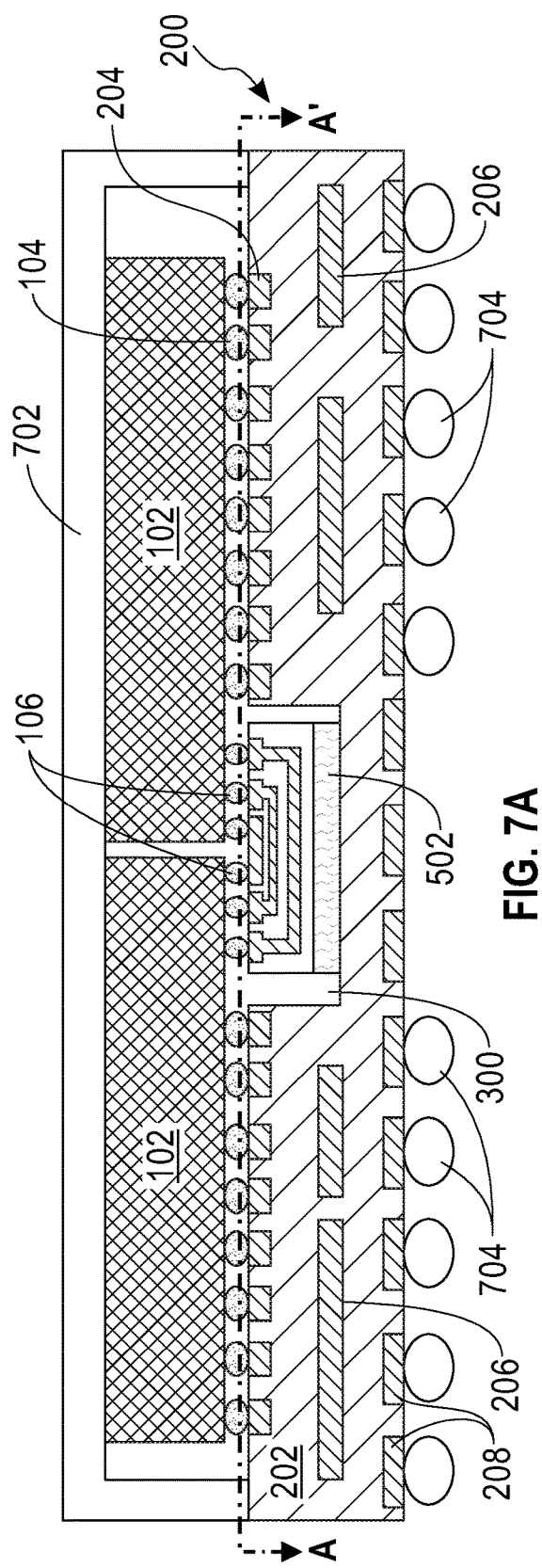
FIG. 7A depicts a cross-sectional view of a multi-chip module, according to an embodiment of the present disclosure.
Figure 7B:
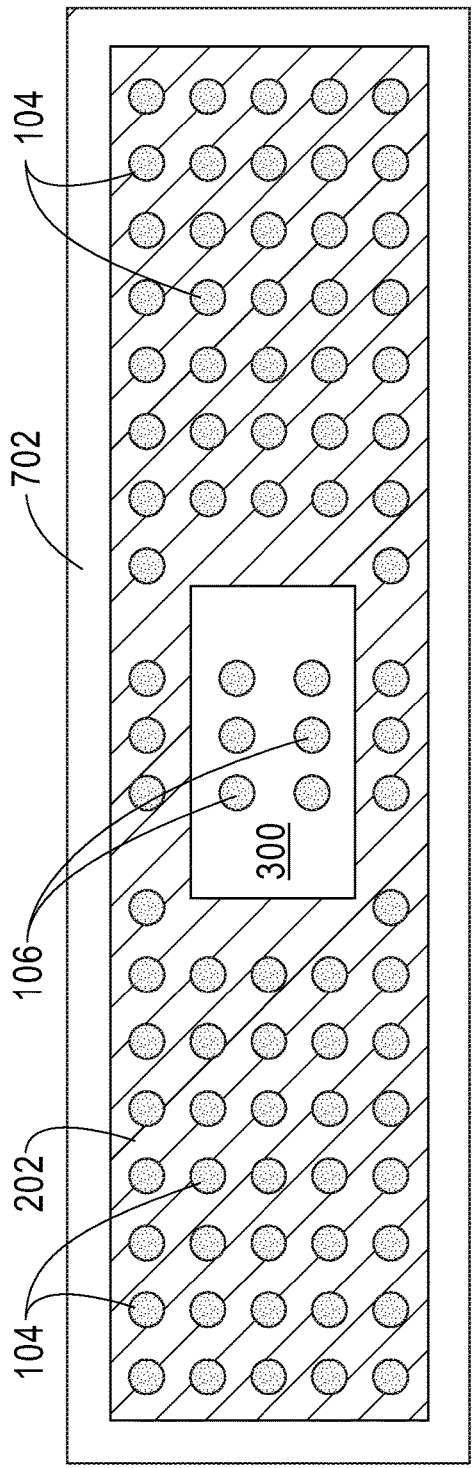
FIG. 7B depicts a top view of FIG. 7A taken along section line A-A', according to an embodiment of the present disclosure.

Referring now to FIGS. 7A-7B, a lid 702 and solder bumps 704 may be formed, according to an embodiment of the present disclosure. In this embodiment, FIG. 7A depicts a cross-sectional view of the multi-chip module, and FIG. 7B depicts a top view of FIG. 7A taken along section line A-A'.

The lid 702 may be formed to provide mechanical stiffness and physical protection to underlying components (e.g. semiconductor chips 102). The lid 702 may be secured to both a top surface of the substrate structure 200 and a bottom surface of the semiconductor chips 102. The lid 702 may be secured to the substrate structure 200 using any known epoxy capable of providing mechanical stiffness and warpage resistance, and to the semiconductor chips 102 with any known adhesive material. The lid 702 may include a recess (not shown) which may be generally located at or near, the center to accommodate the height of the semiconductor chips 102 above the substrate structure 200. In an embodiment, the lid 702 may include any material that provides mechanical stiffness and physical protection to the underlying components, such as, for example, nickel plated copper, anodized aluminum, a ceramic, or any other suitable material. Additionally, in some embodiments, a thermal paste or thermal interface material can also be used between lid 702 and semiconductor chip 102 according to processes well known in the art.

Similar to the solder bumps 104, 106, the solder bumps 704 may be formed to connect the multi-chip structure formed by semiconductor chips 102, silicon bridge chip 300, and substrate structure 200 to other structures or substrates such as mother board or other printed circuit board.

Referring now to FIGS. 8A-8B, a substrate structure 800 including a recess 802 is shown, according to an embodiment of the present disclosure. In this embodiment, FIG. 8A depicts a cross-sectional view of the substrate structure 800, and FIG. 8B depicts a top view of FIG. 8A taken along section line A-A'.

It should be noted that the substrate structure 800 is similar to the substrate structure 200 of FIGS. 2A-2B. Also, the recess 802 may be formed in the same way as the recess 210 of FIG. 2. However, in this embodiment, recess 802 extends through an entire thickness of the substrate structure 800, as shown in FIG. 8A. After forming the recess 800, the chip bonding process may continue by flipping the temporary substrate 400, as will be described in detail below.

Figure 9:
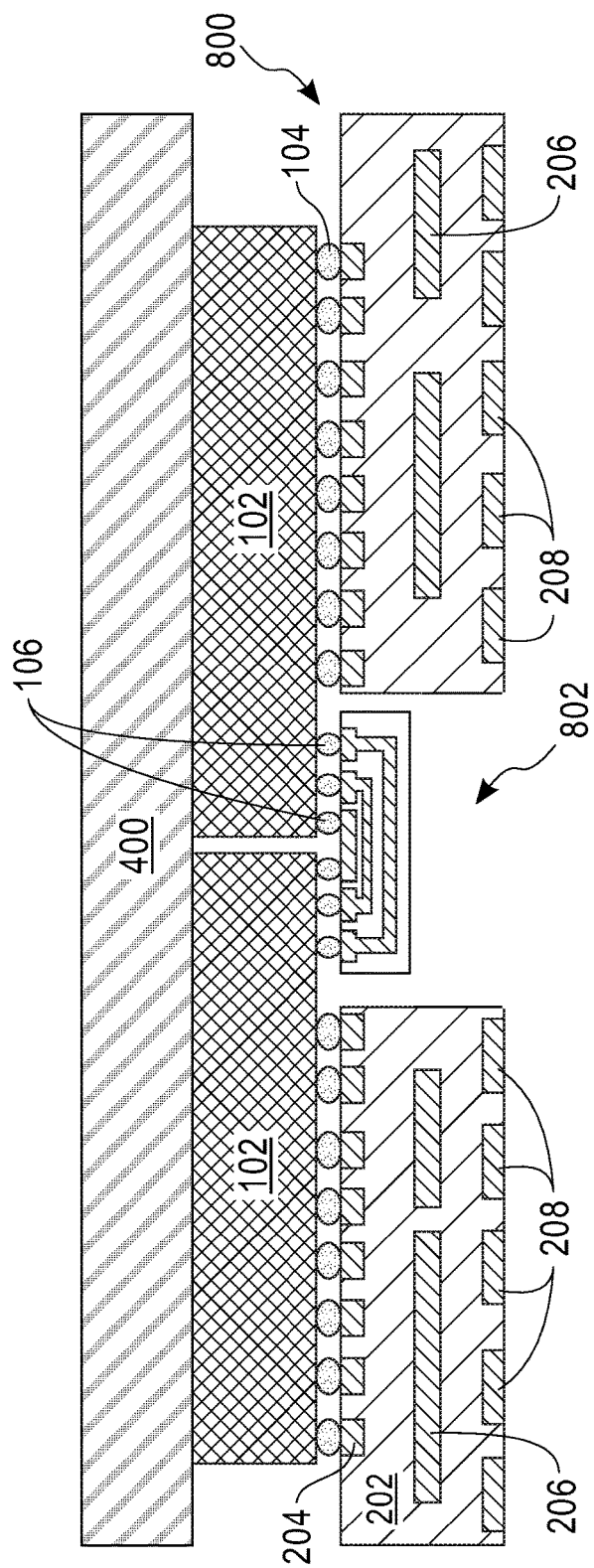
FIG. 9 depicts flipping a temporary substrate, according to an embodiment of the present disclosure.

Referring now to FIG. 9, the temporary substrate 400 may be flipped and place above the substrate structure 800, according to an embodiment of the present disclosure. As described above, the temporary substrate 400 is flipped over so that a top side of the temporary substrate 400 including semiconductor chips 102 and silicon bridge chip 300 face down. The temporary substrate 400 may then be aligned so that silicon bridge chip 300 is aligned with the recess 802, and solder bumps 104 are aligned with matching metal layers 204 in the substrate structure 800. At this point of the manufacturing process solder bumps 104 may be attached to join semiconductor chips 102 to metal layers 204.

Figure 10:
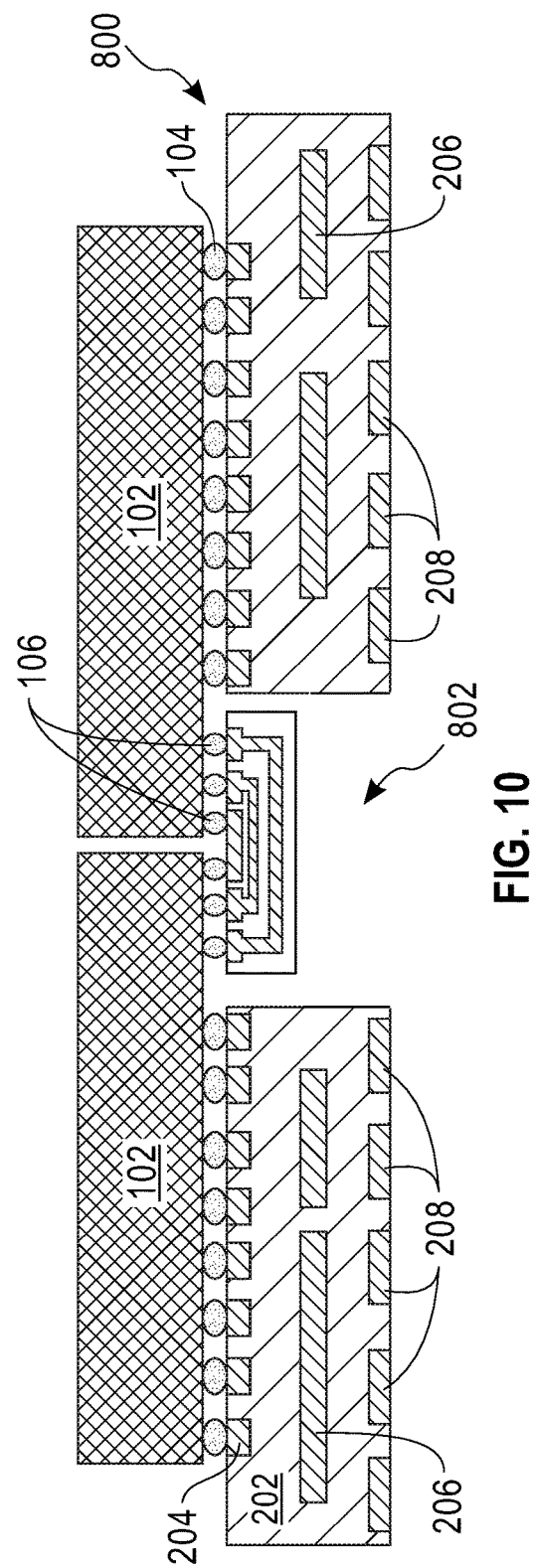
FIG. 10 depicts separating the temporary substrate from semiconductor chip, according to an embodiment of the present disclosure.

Referring now to FIG. 10, the silicon bridge chip 300 may be attached to the substrate structure 800 and the temporary substrate 400 may be separated from the semiconductor chips 102, according to an embodiment of the present disclosure. Specifically, after attaching the silicon bridge chip 300 and semiconductor chips 102 to the substrate structure 800, the temporary substrate 400 may be released. It should be noted that after releasing the temporary substrate 400, semiconductor chips 102 may be exposed.

Referring now to FIGS. 11A-11B, a lid 702, solder bumps 704, and a plug 802 may be formed, according to an embodiment of the present disclosure. In this embodiment, FIG. 11A depicts a cross-sectional view of the multi-chip module, and FIG. 11B depicts a top view of FIG. 11A taken along section line A-A'.

As described above the lid 702 may be formed to provide mechanical stiffness and physical protection to underlying components (e.g., semiconductor chips 102), while solder bumps 704 may be formed to connect the multi-chip structure formed by semiconductor chips 102, silicon bridge chip 300, and substrate structure 800 to other substrate structures or substrates. The plug 804 may be formed to mechanically hold the silicon bridge chip 300. The plug 804 may be formed with any material that has the same thermal properties as the substrate structure 800, such as the same ceramic or laminate material.

The plug 804 may entirely fill a portion of the recess 802 (FIG. 10) below the silicon bridge chip 300, and may be substantially flush or coplanar with a bottom surface of the substrate structure 800.

Another embodiment by which the multi-chip module with non-embedded silicon bridge chip may be formed is described in detailed below by referring to the accompanying drawings in FIGS. 12-13.

Figure 12:
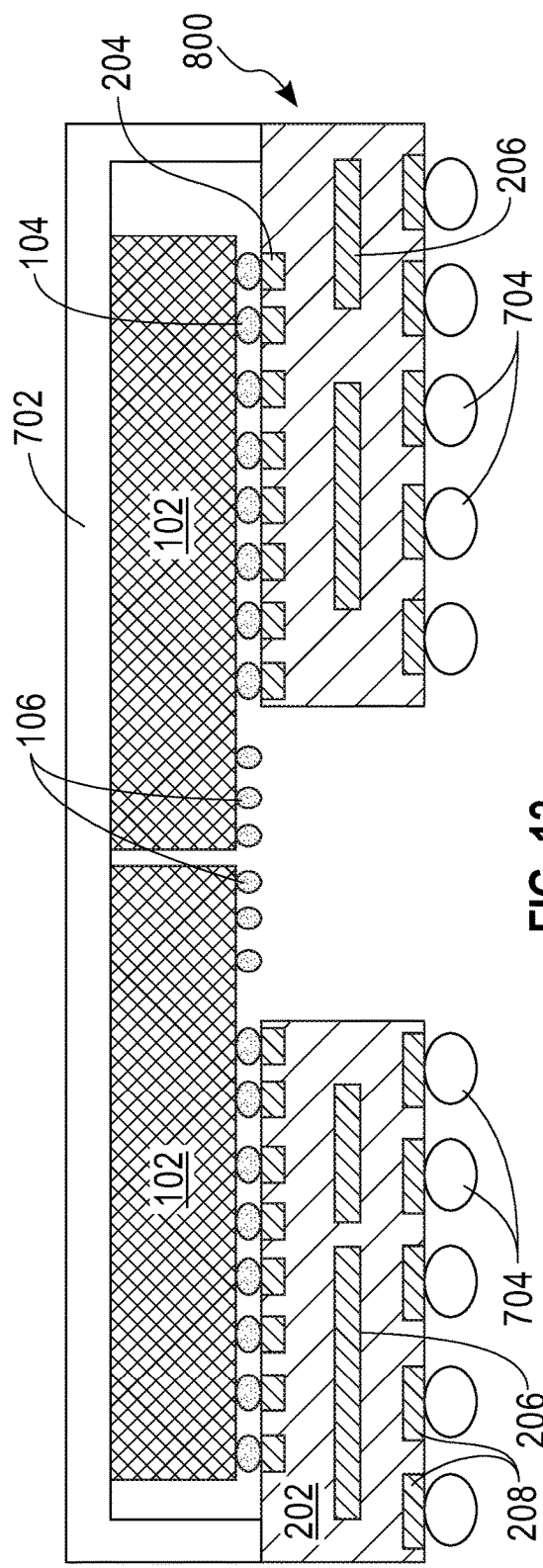
FIG. 12 depicts a cross-sectional view of an alternate multi-chip module, according to an embodiment of the present disclosure.
Figure 13:
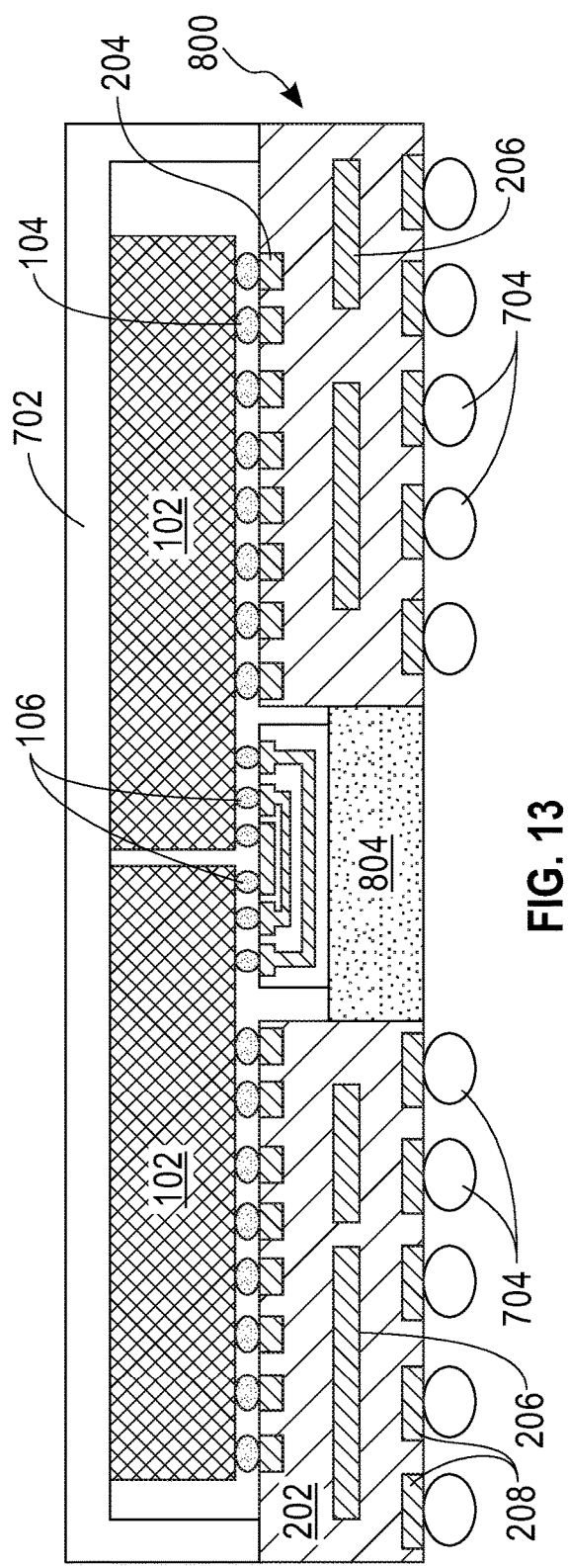
FIG. 13 depicts bonding a silicon bridge chip to the multi-chip module, according to an embodiment of the present disclosure.

Referring now to FIGS. 12-13, an alternate embodiment in which the silicon bridge chip 300 is directly attached to a multi-chip module is shown, according to an embodiment of the present disclosure.

In this embodiment, a multi-chip module including semiconductor chips 102, lid 702, substrate structure 200 and solder bumps 702 has already been formed (FIG. 12). It should be noted that solder bumps 106 located on the top surface of the semiconductor chips 102 have not been attached. This may allow for attaching the silicon bridge chip 300 directly to the semiconductor chips 102 as shown in FIG. 13. The plug 804 may be subsequently formed to mechanically hold the silicon bridge chip 300 as described above.

Therefore, embodiments of the present disclosure provide a method of forming multi-chip modules with a non-embedded silicon bridge chip which may eliminate the need for silicon interposers, thereby reducing layout complexity while improving yield rates. In the proposed method the silicon bridge chip (300) is not embedded inside the substrate structures (200, 800). Moreover, the silicon bridge chip (300) is not part of the substrate structures manufacturing process, the silicon bridge chip (300) is fitted inside a recess in the substrate structures (200, 800) after their fabrication.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor structure comprising:
a silicon-bridge chip comprising a free-floating device electrically joined on a top portion to two or more semiconductor chips and electrically joined on a bottom portion to a substrate structure, the substrate struc- ture comprising a plurality of metal interconnect structures and a plurality of metal layers disposed on an interlevel dielectric, a region of the substrate structure having a recess, the silicon bridge chip being aligned with and extending into the recess, a size of the recess is larger than a size of the silicon-bridge chip causing a separation space between sidewalls of the silicon-bridge chip and sidewalls of the substrate structure, the region of the substrate structure being away from the plurality of metal interconnect structures and the plurality of metal layers such that a top surface of the silicon bridge chip is substantially flush with a top surface of the substrate structure.

2. The semiconductor structure of claim 1, further comprising:

a lid attached to the top surface of the substrate structure and a bottom surface of the two or more semiconductor chips; and a plurality of solder bumps on a bottom surface of the substrate structure.

3. The semiconductor structure of claim 1, further comprising:

an adhesive material between a bottom surface of the silicon bridge chip and a top surface of the substrate structure located directly below the silicon bridge chip, wherein the adhesive material physically joins the silicon bridge chip to the substrate structure.

4. The semiconductor structure of claim 1, further comprising:

the recess extending through an entire thickness of the substrate structure; and a plug in direct contact with a bottom surface of the silicon bridge chip exposed by the recess such that the plug substantially fills a portion of the substrate structure located below the silicon bridge chip, the plug mechanically holds the silicon bridge chip, wherein a bottom surface of the plug is substantially flush with a bottom surface of the substrate structure.

5. The semiconductor structure of claim 1, further comprises:

a first plurality of solder bumps located on an inner top surface of the two or more semiconductor chips; and a second plurality of solder bumps located on an outer top surface of the two or more semiconductor chips, wherein solder bumps in the second plurality of solder bumps are larger than solder bumps in the first plurality of solder bumps.

6. The semiconductor structure of claim 1, wherein each of the two or more semiconductor chips comprises a silicon substrate, and the substrate structure comprises a laminated substrate, a ceramic substrate, or a printed circuit board.

7. The semiconductor structure of claim 1, wherein a location of the recess is selected based on a desired location of the silicon bridge chip within the substrate structure.

8. The semiconductor structure of claim 1, wherein a shape of the recess is selected based on a shape of the silicon bridge chip.

9. The semiconductor structure of claim 1, wherein the region of the substrate structure comprises a center of the substrate structure, an edge of the substrate structure, or a corner of the substrate structure.

* * * * *